United States Patent
Ghassemi et al.

(10) Patent No.: US 8,611,162 B2
(45) Date of Patent: Dec. 17, 2013

(54) CIRCUIT FOR PREVENTING A DUMMY READ IN A MEMORY

(75) Inventors: Hamed Ghassemi, Austin, TX (US); Jogendra C. Sarker, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 329 days.

(21) Appl. No.: 13/075,768

(22) Filed: Mar. 30, 2011

(65) Prior Publication Data

US 2012/0250430 A1     Oct. 4, 2012

(51) Int. Cl.
    *G11C 7/22*     (2006.01)
(52) U.S. Cl.
    USPC ............................................ 365/189.16
(58) Field of Classification Search
    USPC ............................................ 365/189.16
    See application file for complete search history.

(56) References Cited

U.S. PATENT DOCUMENTS

| | | |
|---|---|---|
| 7,193,924 B2 | 3/2007 | Ramaraju et al. |
| 7,808,812 B2 | 10/2010 | Liu et al. |

*Primary Examiner* — Hoai V Ho
*Assistant Examiner* — Tri Hoang
(74) *Attorney, Agent, or Firm* — Daniel D. Hill; Mary Jo Bertani

(57) ABSTRACT

A memory includes a row decoder, column logic, and a memory array having a plurality of memory cells arranged in rows and columns. A plurality of write word lines are coupled to the row decoder. A plurality of complementary write word lines is coupled to the row decoder. A plurality of read bit lines is coupled to the column logic. A plurality of write bit lines is coupled to the column logic. A plurality of column decoded write enable lines is coupled to the column logic. Each memory cell of the plurality of memory cells is coupled to a corresponding write control circuit. Each write control circuit comprises a transmission gate coupled between a column decoded write enable line and an access transistor of a memory cell. The transmission gate is controlled by a write word line signal.

20 Claims, 4 Drawing Sheets

CIRCUIT FOR PREVENTING A DUMMY READ IN A MEMORY

BACKGROUND

1. Field

This disclosure relates generally to integrated circuit memories, and more specifically, to a circuit for preventing a dummy read in a memory.

2. Related Art

One of the most common ways to reduce power consumption in integrated circuits is to lower the power supply voltage. However, lowering the power supply voltage can cause increased failures and unreliable operation in some circuits. For example, reducing the power supply voltage to a memory array can reduce read margins and cause the memory array to be more susceptible to soft errors and process variations. The problem is made worse as transistor sizes decrease. One the other hand, the lower power supply voltage to the memory array can improve write margins.

In a static random access memory (SRAM) used as a cache memory a problem occurs that is commonly known as a "dummy read". A "dummy read" in a cache memory causes the internal storage nodes of a memory cell to be exposed to the precharged bit lines. In turn, this leads to the possibility of unintentionally changing the state of the memory cell. To prevent the memory cells from changing states, the stability of the cell may be improved. The problem with improving cell stability to prevent dummy reads is that the memory cell becomes more difficult to write.

Therefore, what is needed is a memory that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
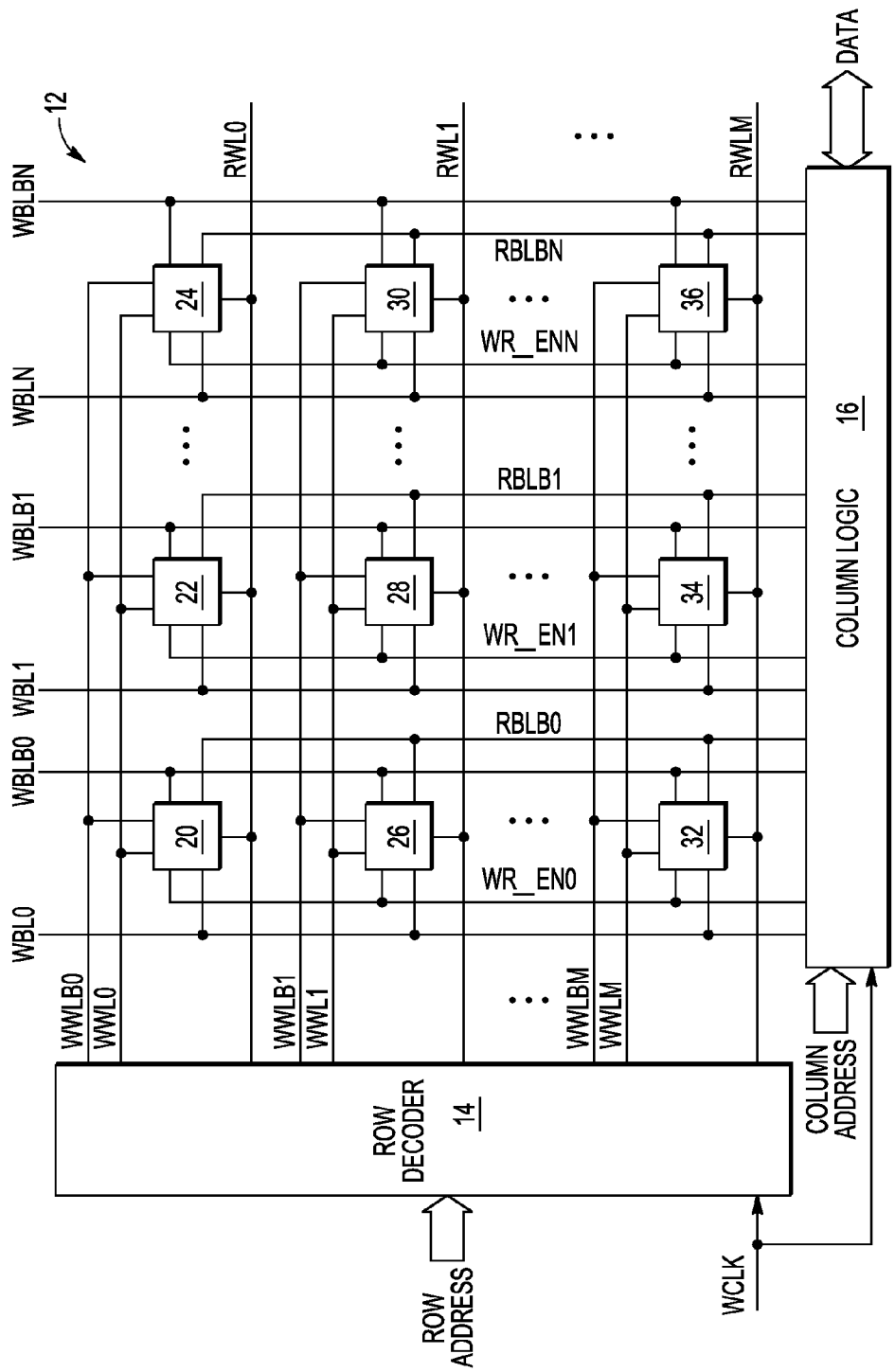
FIG. 1 illustrates, in block diagram form, a memory in accordance with an embodiment.

Generally, there is provided, a dual port SRAM that includes a write word line control circuit for preventing a dummy read to unselected memory cells. The write word line control circuit has an output connected to the gates of the SRAM cell access transistors and includes a transmission gate and a transistor. The transmission gate is coupled between a column decoded write enable signal and the gates of each of the access transistors. The transmission gate is controlled by a write word line select signal. The transistor is coupled between the gates of each of the access transistors and ground. The transistor is controlled by a logical complement of the write word line signal. During a write operation, the column decoded write enable signal will remain low for unselected columns. When a word line is selected by asserting the write word line signal, the transmission gate couples the logic low write enable signal to the gates of the access transistors so that the access transistors remain substantially non-conductive. This eliminates the false, or dummy, reads by preventing the memory cell access transistors from being conductive for columns that are not accessed. Also, controlling the transmission gate with the write word line signal instead of the column select signal reduces timing constraints, and the write operation is faster as a result.

A semiconductor substrate for implementing the memory can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or a "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in block diagram form, a memory in accordance with an embodiment. Generally, memory 10 includes a plurality of memory cells 12, a row decoder 14, and column logic 16. The plurality of memory cells 12 includes representative memory cells 20, 22, 24, 26, 28, 30, 32, 34, and 36. The memory cells 12 are implemented in rows and columns. For example, memory cells 20, 22, and 24 and the word line WWL0 form one row of memory cells. Likewise, memory cells 20, 26, and 32 form one column of memory cells. As illustrated in FIG. 1, each of the memory cells is coupled to first write word lines, such as write word lines labeled "WWL0" to "WWLM", and to second write word lines, such as WWLB0" to "WWLBM", where M is the number of rows minus one. The second write word lines are logical complements of the first write word lines. Each of the memory cells are also connected to one pair of a plurality of pairs of write bit lines labeled "WBL0/WBLB0" to "WBLN/WBLBN", to one of a plurality of read word lines labeled "RWL0"-"RWLM", to one of a plurality of read bit lines labeled "RBLB0" to "RBLBN", and to one of a plurality of column decoded write enable signals labeled "WR_EN0" to "WR_ENN". Note that N is the number of columns minus one and may be the same as or different than M.

Row decoder 14 has an input for receiving a row address labeled "ROW ADDRESS", and a plurality of output terminals coupled to the plurality of write word lines WWL0 to WWLN and WWLB0 to WWLBN. Read word lines RWL0-RWLM are coupled to row decoder 14. Column logic 16 has an input terminal for receiving a column address labeled "COLUMN ADDRESS", a first plurality of terminals coupled to write bit line pairs WBL0/WBLB0-WBLN/WBLBN, a second plurality of terminals coupled to read bit line pairs RWL0-RWLN, and a plurality of input/output (I/O) terminals for receiving or providing data signals labeled "DATA". As illustrated in FIG. 1, the read bit lines, write bit lines, and write enable lines run in the column direction, and the write word lines and read word lines run in the row direction. Column logic 16 includes, for example, column decoders, write enable circuits, sense amplifiers, bit line equalization and precharge circuits, and buffer circuits.

A write clock labeled "WCLK" is provided as an input to row decoder 14 and column logic 16 for synchronizing row and column bit cell access. Write clock WCLK may be generated locally by, for example, a phase locked loop (PLL), or may be provided by a source external to memory 10, such as for example, a processor coupled to memory 10. Note that in the illustrated embodiment, the sense amplifiers for a read operation are single-ended. In another embodiment not illustrated in FIG. 1, the sense amplifiers may be differential.

Memory 10 is implemented as a cache memory in a data processor. The column decoders of column logic 16 select which of the memory cells are to receive or provide data. In one mode, as determined by address signals COLUMN ADDRESS, all of the memory cells coupled to a selected one of write word line signals are enabled to receive data signals from the bit lines. In another mode, a selected portion of less than all of the memory cells coupled to a write word line are enabled to receive data signals from the write bit lines. In the illustrated embodiment, the value of address signals COLUMN ADDRESS determines which memory cells of a row are selected to receive data during a write operation or to provide data during a read operation.

Figure 2:
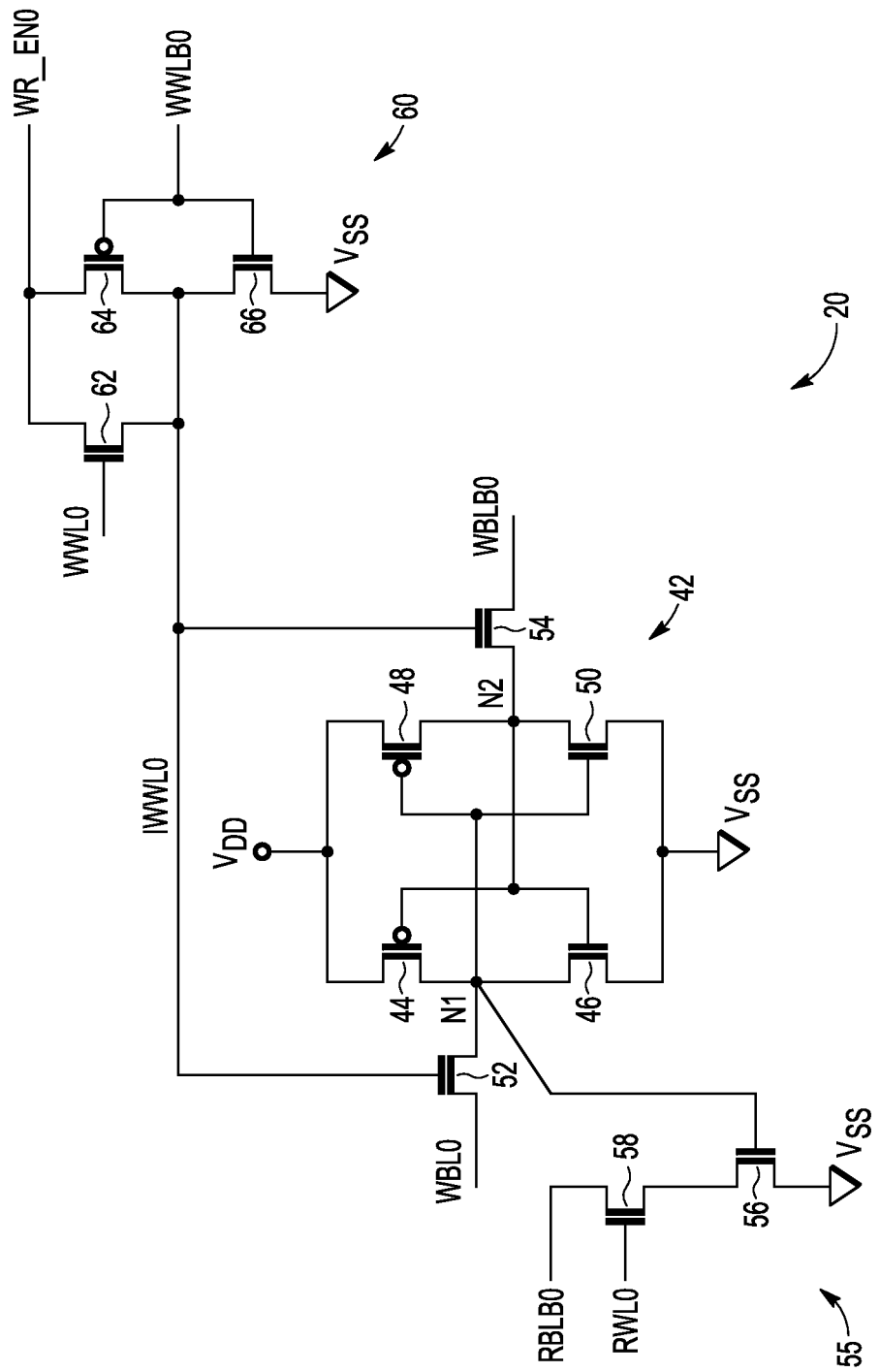
FIG. 2 illustrates, in schematic diagram form, a memory cell of the memory of FIG. 1 in accordance with an embodiment.

FIG. 2 illustrates, in schematic diagram form, a memory cell 20 of memory 10 of FIG. 1 in accordance with an embodiment. The memory cell 20 is a dual-port SRAM cell and includes a storage cell 42, access transistors 52 and 54, a read port 55, and a write control circuit 60. Read port 55 is for providing a single-ended data signal and includes transistors 56 and 58. In the illustrated embodiment, storage cell 42 is a cross-coupled pair of inverters. One inverter of the cross-coupled pair of inverter 42 includes a P-channel transistor 44 and an N-channel transistor 46. The other inverter includes P-channel transistor 48 and N-channel transistor 50. Storage cell 42 is supplied with a power supply voltage provided at a power supply voltage terminal labeled "VDD". A power supply voltage terminal VSS is coupled to ground. In one embodiment, the power supply voltage is equal to about 1 volt. In another embodiment, the power supply voltage may be different. Access transistor 52 couples a storage node N1 to the write bit line WBL0. Access transistor 54 couples a storage node N2 to the write bit line WBLB0. The read port 55 includes an N-channel transistor 56 having a gate coupled to the storage node N1, a drain, and a source coupled to a power supply voltage terminal labeled "VSS". N-channel transistor 58 has a source coupled to the drain of transistor 56, a gate for receiving read word line signal RWL0, and a drain coupled to read bit line RBLB0.

Write control circuit 60 includes N-channel transistors 62 and 66 and P-channel transistor 64. N-channel transistor 62 and P-channel transistor 64 form a transmission gate. Transistor 62 has a drain (current electrode) for receiving column decoded write enable signal WR_EN0, a gate (control electrode) for receiving write word line signal WWL0, and a source (current electrode) connected to the gates of access transistors 52 and 54. P-channel transistor 64 has a source connected to the drain of transistor 62 for receiving write enable signal WR_EN, a gate for receiving word line signal WWLB0, and a drain connected to the gates of access transistors 52 and 54 for providing an internal write word line signal labeled "IWWL0". N-channel transistor 66 has a drain connected to the drain of transistor 64, a gate for receiving write word line signal WWLB0, and a source connected to power supply voltage terminal VSS. Note that in one embodiment, an inverter (not shown) is provided in row decoder 14 to generate signal WWLB0 from WWL0. In another embodiment, an inverter (not shown) can be provided in each of the memory cells to generate signal WWLB0 from WWL0.

During a write operation to memory cell 20, a differential voltage is provided to bit line pair WBL0/WBLB0. Write word line signal WWL0 and column decoded write enable signal WR_EN0 are asserted as logic high voltages and write word line signal WWLB0 is asserted as a logic low voltage. The logic high write word line signal WWL0 causes transistor 62 to be conductive, and the logic low write word line signal WWLB0 causes transistor 64 to be conductive and transistor 66 to be substantially non-conductive. The logic high signal WR_EN0 is provided to access transistors 52 and 54 from column logic 16 via the transmission gate comprising transistors 62 and 64. Access transistors 52 and 54 then couple the storage nodes N1 and N2 to write bit lines WBL0 and WBLB0, respectively. The bit line pair logic state overwrites the previously stored logic state and is latched by cross-coupled pair 42.

During a read operation to memory cell 20, the bit line RBLB0 is precharged to a logic high voltage approximately equal to the voltage provided at power supply voltage terminal VDD. The read word line RWL0 is asserted as a logic high voltage to cause transistor 58 to be conductive. If storage node N1 is storing a logic low voltage, N-channel transistor 56 is substantially non-conductive and the voltage on read bit line RBLB0 will remain a logic high. However, if storage node N1 is storing a logic high voltage, transistor 56 will be conductive, and the voltage on bit line RBLB0 will be pulled to the voltage of power supply voltage terminal VSS. Note that read port 55 may be coupled to node N2, or to both nodes N1 and N2. Also, in the illustrated embodiment, VSS is at ground potential and VDD is provided with a positive power supply voltage. In the illustrated embodiment, VDD is one volt or less. In other embodiments, the supply voltages may be different.

In a typical embedded SRAM, such as in a cache memory, all of the memory cells of a row are accessed at the same time for read and write operations. However, some operating modes may require that less than all of the memory cells of a row be accessed. During a write operation of less than all of the memory cells of a row in some prior art cache memories, the storage nodes of all of the memory cells of a row are coupled to the bit lines, even when some of the memory cells are not written. In some prior art memories, the bit lines of the cells not written to may be precharged to VDD. However, unnecessarily coupling the unwritten memory cells to the precharged bit lines in this manner may cause excessive power consumption and may cause the logic states of the unselected memory cells to be disturbed. That is, the storage node having the lower voltage is coupled to and charged by the precharged bit line. By using write control circuit 60 for coupling a storage cell to a bit line, the storage nodes of unaccessed cells are not exposed to the bit line precharge voltages. Also, by controlling the transmission gate comprising transistors 62 and 64 with the write word line signal WWL, timing control of the write operation is easier because write enable signal WR_EN can be treated as a DC signal with respect to the write word line signal WWL. The use of an active gate, as described above, allows the transmission gate to be formed with relatively smaller transistors and still have the same performance as a prior art memory. Also, the write word line signals WWL and WWLB are exposed to less signal loading because the write word line signals are only provided to the gates of transistors 62 and 64 and not also to the gates of the memory cell access transistors. In addition, write control circuit 60 only needs one column select signal (WR_EN) instead both the true and complement column select signals, thus reducing the memory cell pitch in the row direction.

Figure 3:
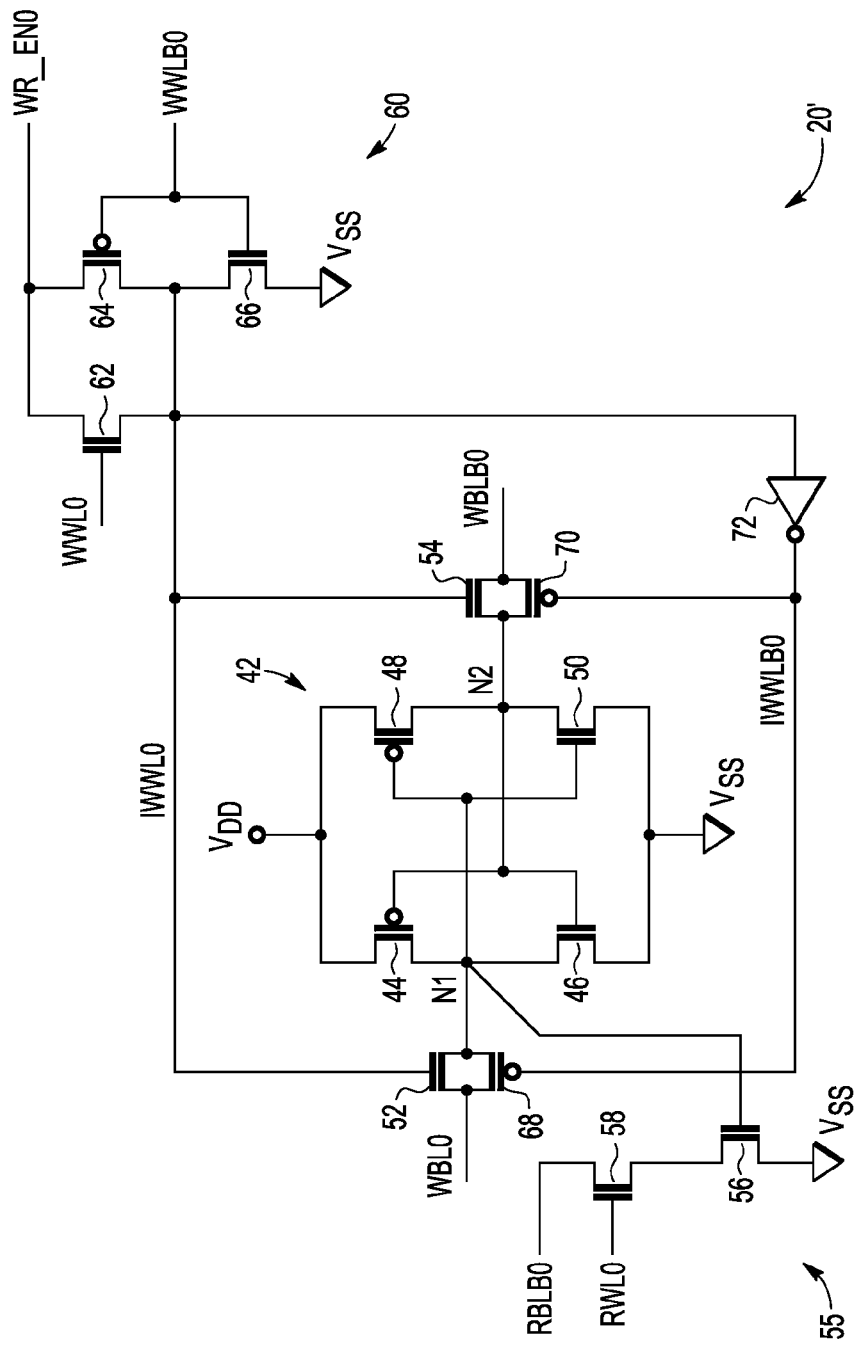
FIG. 3 illustrates, in schematic diagram form, a memory cell of the memory of FIG. 1 in accordance with another embodiment.

FIG. 3 illustrates, in schematic diagram form, memory cell 20' of the memory of FIG. 1 in accordance with another embodiment. Memory cell 20' is the same as memory cell 20 except that storage nodes of memory cell 20' are coupled to the bit lines by full transmission gates instead of single access transistors. In memory cell 20', a P-channel transistor 68 is connected in parallel with N-channel transistor 52 to form one transmission gate. Also, a P-channel transistor 70 is connected in parallel with N-channel transistor 54 to form another transmission gate. An inverter 72 has an input connected to receive internal write word line signal IWWL0, and an output for providing internal write word line signal IWWLB0 to the gates of P-channel transistors 68 and 70. When internal write word line signal IWWL0 is a logic high voltage, causing transistors 52 and 54 to be conductive, internal write word line signal IWWLB0 is provided as a logic low, causing transistors 68 and 70 to be conductive. By using full transmission gates instead of single N-channel pass transistors to connect the storage nodes to the bit lines, a threshold voltage drop across the N-channel pass transistors is avoided so that a full high level voltage is provided to the bit cell storage nodes, thus improving the ability to write to the memory cells.

Figure 4:
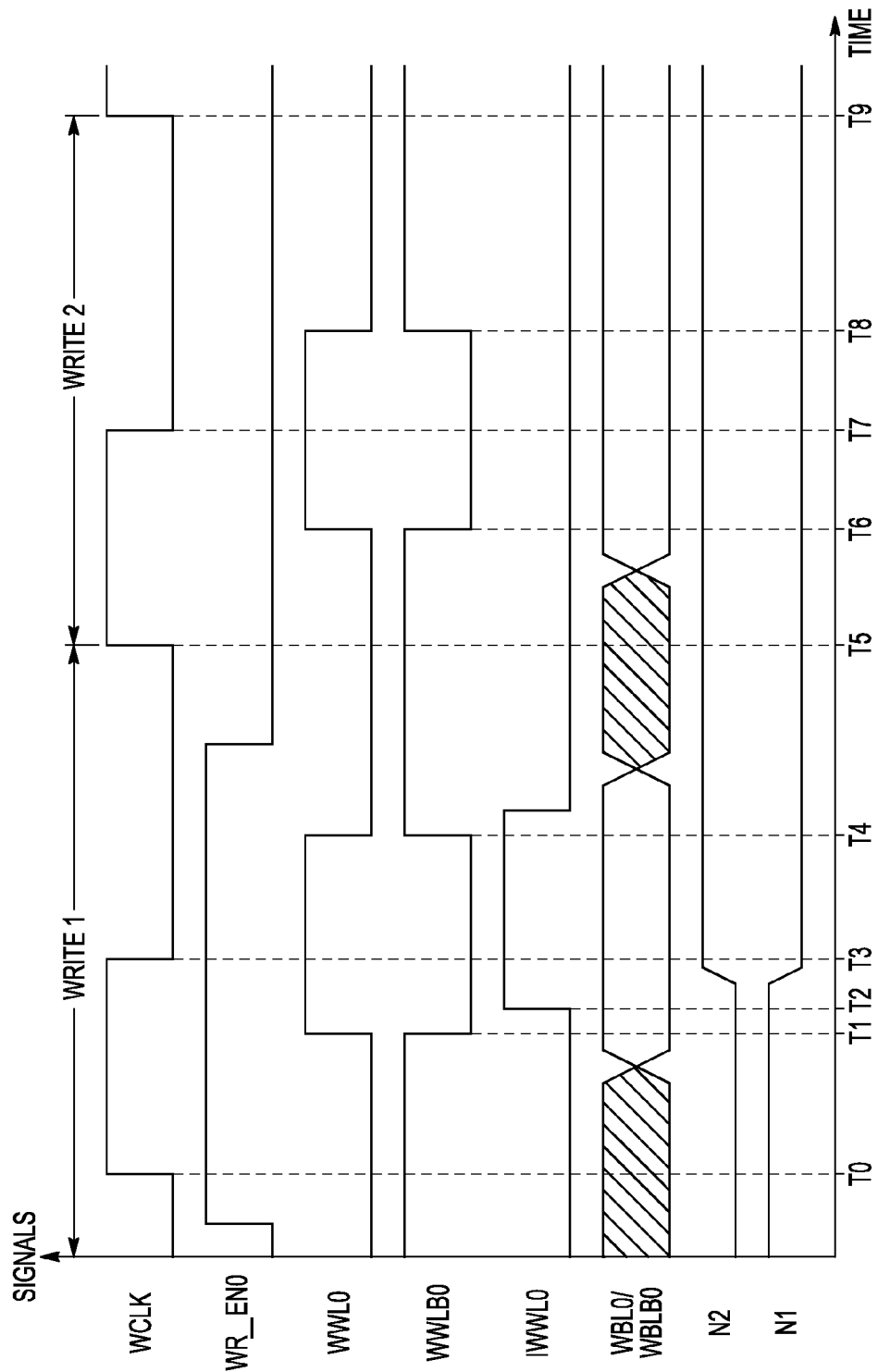
FIG. 4 illustrates a timing diagram of various signals of the memory of FIG. 1.

FIG. 4 illustrates a timing diagram of various signals useful for understanding the operation of memory 10. In FIG. 4, a first write operation labeled "WRITE 1" is defined by a first cycle of write clock WCLK and a second write operation labeled "WRITE 2" is defined by a second cycle of write clock WCLK. In the first write operation, memory cell 20 is the subject of the write operation. In the second write operation, memory cell 20 is not the subject of the write operation. Note that the description of FIG. 4 also applies equally to the operation of memory cell 20'.

Time T0 marks the beginning of the first write operation. Just prior to time T0, write enable signal is asserted as a logic high, indicating that memory cell 20 is to be written to. At time T1 write word line signals WWL0 and WWLB0 are asserted. After a short delay, at time T2, internal write word line signal IWWL0 is asserted causing access transistors 52 and 54 to be conductive. A valid signal on bit line pair WBL0 and WBLB0 is provided to storage nodes N1 and N2 before time T2 causing the logic states on storage nodes N1 and N2 to change. Write clock WCLK transitions to a logic low at time T3. At time T4 write word line signals WWL0 and WWLB0 are negated ending the first write operation. After time T4, internal write word line signal IWWL0 is negated as a result of write word line signals WWL0 and WWLB0 being negated.

Time T5 marks the beginning of the second write operation. Memory cell 20 is not the subject of the write operation but is on the same word line as memory cells that are to be subjected to the write operation. At time T5, write clock WCLK transitions to a logic high. At time T6, write word line signals WWL0 and WWLB0 are asserted and data is present on the bit line pair WBL0/WBLB0. However, because memory cell 20 is not to be written to, column decoded write enable signal WR_EN0 is not asserted to select the column to which memory cell 20 belongs. Internal write word line signal IWWL0 is not asserted as a logic high, and access transistors 52 and 54 remain substantially non-conductive. The stored logic states of storage nodes N1 and N2 do not change in response to bit line signals WBL0/WBLB0. At time T8 write word line signals WWL0 and WWLB0 are negated. At time T8, the second write operation ends. At time T9 another write operation may begin.

Although the invention has been described with respect to specific conductivity types or polarity of potentials, skilled artisans appreciated that conductivity types and polarities of potentials may be reversed.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
a plurality of write word lines;
a plurality of complementary write word lines;
a plurality of write bit line pairs;
a plurality of read bit lines;
a plurality of read word lines;
a plurality of memory cells;
a plurality of column decoded write enable lines; and
a plurality of write control circuits, a write control circuit of the plurality of write control circuits comprising:
   a transmission gate having a first current terminal coupled to a column decoded write enable line of the plurality of column decoded write enable lines, a second current terminal coupled to a control electrode of an access transistor of a memory cell of the plurality of memory cells, a first control terminal coupled to a write word line of the plurality of write word lines, and a second control terminal coupled to a complementary write word line of the plurality of complementary write word lines, wherein a signal on the column decoded write enable line is passed through to the control electrode of the access transistor when a signal on the write word line is asserted; and a transistor having a first current electrode coupled to the second current terminal of the transmission gate, a second current electrode coupled to a power supply voltage terminal, and a control electrode coupled to the complementary write word line.

2. The memory of claim 1, wherein the access transistor has a first current electrode coupled to a storage node of the memory cell, a second current electrode coupled to a write bit line of the plurality of write bit line pairs, and the control electrode coupled to the second current terminal of the transmission gate.

3. The memory of claim 1, wherein the memory cell comprises:

a storage cell having a first storage node and a second storage node;

the access transistor having a first current electrode coupled to a first write bit line of the plurality of write bit lines, a second current electrode coupled to the first storage node, and the control electrode coupled to the second current terminal of the transmission gate; and a read port for coupling data from the first storage node to a first read bit line of the plurality of read bit lines.

4. The memory of claim 1, wherein the transmission gate comprises:

a first transistor having a first current electrode coupled to the column decoded write enable line, a second current electrode coupled to the access transistor of the memory cell, and a control electrode coupled to the write word line; and a second transistor having a first current electrode coupled to the first current electrode of the first transistor, a second current electrode coupled to the second current electrode of the first transistor, and a control electrode coupled to the complementary write word line.

5. A memory comprising:

a row decoder;

a column logic; and a memory array coupled to the row decoder and the column logic, comprising:

a plurality of memory cells arranged in rows and columns;

a plurality of write word lines coupled to the row decoder, running in a row direction;

a plurality of complementary write word lines coupled to the row decoder, running in a row direction;

a plurality of read bit lines, coupled to the column logic, running in a column direction that carry data that has been read from the plurality of memory cells;

a plurality of write bit lines, coupled to the column logic, running in the column direction, wherein the write bit lines carry data for writing into the plurality of memory cells;

a plurality of decoded write enable lines, coupled to the column logic, running in the column direction;

a plurality of write control circuits;

wherein:

each memory cell of the plurality of memory cells is coupled to a predetermined one of the plurality of write control circuits, a predetermined one of the read bit lines of the plurality of read bit lines, and a first predetermined one of the write bit lines of the plurality of write bit lines;

each write control circuit comprises:

a transmission gate having a first control input coupled to one of the plurality of write word lines, a second control input coupled to one of the plurality of complementary write word lines, an input coupled to one of the plurality of decoded write enable lines, and an output coupled to one of the plurality of memory cells, wherein a signal on the one of the plurality of decoded write enable lines is passed through to the one of the plurality of memory cells when a signal on the write word line is asserted; and a first transistor having a control electrode coupled to the complementary write word line input, a first current electrode coupled to a ground terminal, and a second current electrode coupled to the output of the transmission gate.

6. The memory of claim 5, wherein the transmission gate further comprises:

a second transistor having a first current electrode coupled to the one of the plurality of decoded write enable lines, a second current electrode coupled to the second current electrode of the first transistor, and a control input coupled to the complementary write word line input.

7. The memory of claim 6, wherein the transmission gate further comprises:

a third transistor having a first current electrode coupled to the first current electrode of the second transistor, a second current electrode coupled to the second current electrode of the second transistor, and a control electrode coupled to the write word line input.

8. The memory of claim 5, wherein the plurality of decoded write enable lines provide a plurality of write enable signals for controlling write operations in the plurality of memory cells in response to a column address signal.

9. The memory of claim 5, wherein the transmission gate passes a logic high signal when a write enable signal provided by the one of the plurality of write enable lines is a logic high and the transmission gate passes a logic low signal when the write enable signal is a logic low.

10. The memory of claim 5, wherein the first transistor is an N-channel transistor.

11. The memory of claim 7, wherein the second transistor is a P-channel transistor and the third transistor is an N-channel transistor.

12. The memory of claim 5, wherein each memory cell has a first storage node and a second storage node.

13. The memory of claim 12, wherein each memory cell has a second transistor having a first current electrode coupled to the first predetermined one of the plurality of write bit lines, a second current electrode coupled to the first storage node, and a control electrode coupled to the write control circuit.

14. The memory of claim 12, wherein each memory cell has a read port coupled to a predetermined one of the first storage node and the second storage node and coupled to the predetermined one of the read bit lines.

15. The memory of claim 13, wherein each memory cell has a third transistor having a first current electrode coupled to a predetermined one of the complementary write bit lines, a second current electrode coupled to the second storage node, and a control electrode coupled to the write control circuit.

16. The memory of claim 5 wherein the plurality of memory cells is powered by a power supply voltage not greater than about one volt.

17. A memory comprising:
a plurality of write word lines oriented substantially in a first direction;
a plurality of complementary write word lines oriented substantially in the first direction;
a plurality of write bit lines oriented substantially in a second direction;
a plurality of complementary write bit lines oriented substantially in the second direction;
a plurality of read bit lines oriented substantially in the second direction;
a plurality of read word lines oriented substantially in the first direction;
a plurality of memory cells;
a plurality of write enable lines oriented substantially in the second direction; and
a plurality of write control circuits, a write control circuit of the plurality of write control circuit corresponds to a memory cell of the plurality of memory cells, each of the plurality of write control circuits comprising:
a first transistor having a first current electrode coupled to a write enable line of the plurality of write enable lines, a second current electrode coupled to the memory cell, and a control electrode coupled to a write word line of the plurality of write word lines;
a second transistor having a first current electrode coupled to the first current electrode of the first transistor, a second current electrode coupled to the second current electrode of the first transistor, and a control electrode coupled to a complementary write word line of the plurality of complementary write word lines; and
a third transistor having a first current electrode coupled to the memory cell, a second current electrode coupled to a power supply voltage terminal, and a control electrode coupled to the complementary write word line, and wherein a signal on the write enable line is passed through to the memory cell when a signal on the write word line is asserted.

18. The memory of claim 17, wherein the memory cell comprises:
a storage cell having a first storage node and a second storage node;
a first access transistor having a first current electrode coupled to the first storage node, a second current electrode coupled to a write bit line of the plurality of write bit lines, and a control electrode coupled to the second current electrodes of the first and second transistors; and
a second access transistor having a first current electrode coupled to the second storage node, a second current electrode coupled to a complementary write bit line of the plurality of complementary write bit lines, and a control electrode coupled to the second current electrodes of the first and second transistors.

19. The memory of claim 18, wherein the plurality of write enable lines is coupled to a column decoder.

20. The memory of claim 17, wherein the first and third transistors are characterized as being N-channel transistors and the second transistor is characterized as being a P-channel transistor.

* * * * *